United States Patent
Biarne et al.

(10) Patent No.: US 7,832,913 B2
(45) Date of Patent: Nov. 16, 2010

(54) EQUIPPED FLEXIBLE ELECTRONIC SUPPORT, SUPPORTING AT LEAST ONE LIGHT EMITTING DIODE, AND THE ASSOCIATED MANUFACTURING METHOD

(75) Inventors: Vincent Biarne, Sevran (FR); Gérard Billot, Montfermeil (FR)

(73) Assignee: Veleo Vision, Bobigny (FR)

( * ) Notice: Subject to any disclaimer, the term of this patent is extended or adjusted under 35 U.S.C. 154(b) by 187 days.

(21) Appl. No.: 12/101,265

(22) Filed: Apr. 11, 2008

(65) Prior Publication Data
US 2008/0253145 A1  Oct. 16, 2008

(30) Foreign Application Priority Data
Apr. 13, 2007  (FR) .................................... 07 02702

(51) Int. Cl.
*B60Q 1/00* (2006.01)
*F21V 29/00* (2006.01)
(52) U.S. Cl. ........................ 362/547; 362/245; 362/265; 362/294
(58) Field of Classification Search ................. 362/543, 362/545, 547–549, 631, 646, 265, 294
See application file for complete search history.

(56) References Cited
U.S. PATENT DOCUMENTS

| | | | |
|---|---|---|---|
| 4,532,152 A * | 7/1985 | Elarde .......................... | 216/13 |
| 5,977,489 A * | 11/1999 | Crotzer et al. .............. | 174/257 |
| 6,299,337 B1 * | 10/2001 | Bachl et al. .................. | 362/545 |
| 6,520,669 B1 * | 2/2003 | Chen et al. .................... | 362/545 |
| 6,641,284 B2 * | 11/2003 | Stopa et al. .................. | 362/240 |
| 6,860,620 B2 | 3/2005 | Kuan et al. | |
| 7,128,442 B2 * | 10/2006 | Lee et al. ..................... | 362/278 |
| 7,268,479 B2 | 9/2007 | Aisenbrey | |
| 2004/0189170 A1 | 9/2004 | Aisenbrey | |
| 2004/0223327 A1 | 11/2004 | Kuan et al. | |
| 2004/0223328 A1 | 11/2004 | Lee et al. | |
| 2007/0268703 A1 * | 11/2007 | Gasquet et al. ............. | 362/294 |

FOREIGN PATENT DOCUMENTS

| | | |
|---|---|---|
| DE | 10254662 A1 | 6/2004 |
| FR | 2881274 A1 | 7/2006 |

\* cited by examiner

*Primary Examiner*—Jacob Y Choi
(74) *Attorney, Agent, or Firm*—Jacox, Meckstroth & Jenkins

(57) ABSTRACT

A motor vehicle light comprising an equipped flexible electronic support that comprises: a flat flexible insulating support equipped on a first face with a plurality of flat conductive tracks; at least one light source of the light emitting diode type disposed on the first face of the flexible insulating support; wherein a second face of the flexible insulating support is covered with a layer of thermally conductive material for dissipating the heat produced by the light emitting diodes, the layer comprising an area of contact with the diode and an extended area extending out of this contact area, the dissipation of the heat taking place essentially at this extended area.

19 Claims, 1 Drawing Sheet

EQUIPPED FLEXIBLE ELECTRONIC SUPPORT, SUPPORTING AT LEAST ONE LIGHT EMITTING DIODE, AND THE ASSOCIATED MANUFACTURING METHOD

BACKGROUND OF THE INVENTION

1. Field of the Invention

This invention relates to motor vehicle lights and more particularly to a flexible support for supporting at least one light emitting diode.

So-called conventional printed circuits have an insulating support consisting of a resin plate that has a certain flexibility, in the sense that it can be curved or arched by exerting a force on each side of the circuit. However, the deformation of the resin plate is limited to one or even two inflection points and the curvature cannot be too pronounced. In addition, these plates are resilient and it is difficult to keep them in a deformed configuration.

The field of the invention is, in general terms, that of motor vehicle headlights. In this field, various types of headlight are known, among which there are essentially:

- side lights, with low intensity and range;
- passing or low beams, with higher intensity and a range on the road of around 70 meters;
- long-range high beams, and supplementary lights of the long-range type, whose area of vision on the road is around 200 meters;
- improved headlights, referred to as dual function, which combine the functions of low beams and high beams by incorporating a movable shade;
- fog lights;
- signalling lights;
- signalling devices for daytime use, referred to a DRL lights (standing for daytime running lights in English) etc.

For all these lights, traditionally, light sources of the halogen lamp or discharge lamp type are used. However, for a few years now, automotive equipment manufacturers have proposed the use of light emitting diodes; this use initially concerned essentially indicator lights or rear lights, but an increase in the power available in LEDs now makes it possible to envisage new uses of these light sources, in particular for performing the light functions present at the front of the vehicle, and more precisely the DRL and side light functions. Light emitting diodes allowing the performance of this type of function are designated as power LEDs. A power LED is more generally an LED making it possible, alone or in association with other LEDs, to perform lighting functions other than signalling functions and the function associated with signalling devices disposed at the rear of the vehicle. A power LED generally has a light flux of around at least 30 lumens.

Light emitting diodes have a certain number of advantages:

- first of all, for a long time, it has been known that this type of diode does not radiate directionally but radiates in a half-space opposite to a substrate that supports the p-n junction of the diode in question; thus, by using a more directional radiation than the halogen or discharge lamps of the prior art, the quantity of energy lost is less than with discharge or halogen lamps;
- next, these diodes have recently been improved in terms of radiation power intensity. In addition, the diodes manufactured have long been emitting radiation in the red range, but now also in the white range, which increases the field of their uses that can be envisaged. With regard to the LEDs used in signalling, the quantity of heat that they give off is relatively limited, and a certain number of constraints, relating to the dissipation of the heat in the headlight devices of the prior art, disappear; the problem of heat dissipation does however remain significant for power LEDs;
- finally, diodes consume less energy, even at an equal intensity of radiation, than discharge lamps or halogen lamps; they are compact, and their particular shape offers novel possibilities for producing and arranging complex surfaces that are associated with them, in particular by disposing them on electronic supports of the flexible electronic support type.

More and more, in particular to meet aesthetic criteria required by motor manufacturers, it is sought to dispose three-dimensionally, within the same headlight device, several light emitting diodes: within a given lighting device, various LEDs, possibly different types, are disposed on different support planes; in other words, a three-dimensional optical piece can now be intended to receive and hold a plurality of light sources in different planes.

The existing solutions for such juxtapositions initially consisted, in the case of LEDs, essentially of using rigid electronic supports, known to persons skilled in the art, of the CEM1, FR4, SMI or MCPCB substrate type or the like for supporting the various light sources. The use of rigid electronic supports has in particular a high manufacturing cost and drawbacks in terms of interconnection of the different substrates.

2. Description of the Related Art

In the prior art, a particular solution has recently been proposed for effecting a placing of light emitting diodes in a three-dimensional environment. Thus the patent FR 2881274 describes a flexible electronic support equipped with LEDs allowing a simplified assembling on a reflector comprising several LED support planes. Radiator elements are assembled on a first face of the flexboard. The LEDs are fixed to a second face of the flexboard, each LED being positioned so that a radiator element is associated with it directly on each side of the flexboard. Each radiator element comprises openings intended to receive a fixing pin pointing at a rear face of the reflector. This makes it possible to assemble the equipped flexboard and the reflector in a simple and precise manner by introducing one of the fixing pins of the reflector into each opening.

However, the current use of power LEDs makes it necessary to further improve the discharge of heat at the LEDs.

What is needed, therefore, is a system, flexible support and method that overcomes one or more of the problems of the prior art.

SUMMARY OF THE INVENTION

The aim of the invention is therefore to find a device integrating an equipped support that makes it possible to further discharge the heat emitted by LEDs and in particular power LEDs.

The object of the present invention is an equipped electronic support supporting at least one light emitting diode, or LED, and more particularly an equipped flexible electronic support of the equipped "flexboard" type supporting at least one LED.

The expression "flexible electronic support", also designated by the expression flexible printed circuit, or the English term "flexboard", means an assembly constituted by an electrically insulating support, flexible and planar—also designated as a flexible insulating support—and flat metal conductors intended to provide electrical connections between electronic components that will be disposed at the surface of the said support.

The flexible electronic supports as defined in the present application are distinguished from the other printed circuits by the fact that, instead of a resin plate, the insulating support is a flexible insulating support thus making it possible to confer on the flexible electronic support orientations and forms with almost as much freedom as with a tape or a sheet. These flexible electronic supports can thus easily be adapted to complex three-dimensional configurations having many angles or inflection points. This type of flexible electronic support is for example used in the device disclosed by the patent FR 2881274.

The expression "equipped flexible electronic support" means an assembly constituted by a flexible electronic support, electronic components that are disposed thereon—in particular light emitting diodes—and any ancillary element of the radiator type, fixing support, stiffening element, etc.

The aim of the invention is essentially to propose a solution for equipping a three-dimensional optical piece—for example a reflector, a screen, a mask, or any part able to serve as a fixing piece within a motor vehicle headlight module—with light sources of the LED type, the solution being compact and in particular meeting significant constraints in terms of the dissipation of heat generated by the LEDs.

The use of flexible electronic supports is advantageous because of their flexible character: they can be bent easily in order to place them three-dimensionally on an optical part of any shape. Another important advantage of flexible electronic supports lies in the fact that they require no connection system for interconnection between different electronic cards, affording a saving in labor, making the assembly reliable and reducing the overall size compared with the solutions involving rigid supports.

The object of the invention proposes a solution meeting the heat dissipation constraints of flexboards equipped with LEDs, in particular power LEDs, whilst having minimum bulk. To this end, it is proposed in the invention to associate a layer of thermally conductive material on the face of the flexboard opposite to the face supporting the light emitting diodes. Thermally conductive material means here a material having a satisfactory dissipation capacity, sufficient to discharge all the calories produced by the LEDs.

Advantageously, in the invention, each LED is associated with a stiffening element providing rigid holding for the LED in question, facilitating the operation of manufacturing the equipped flexboard.

The invention therefore concerns essentially an equipped electronic support for a motor vehicle light, the equipped electronic support comprising in particular:
  a flat flexible insulating support equipped on a first face with plurality of flat conductive tracks;
  at least one light source of the light emitting diode type disposed on the first face of the flexible insulating support and connected to at least one of the flat conductive tracks;
  a second face of the flexible insulating support being covered at least partially by a layer of thermally conductive material for dissipating the heat produced by the light emitting diodes, the layer comprising a contact area at the connection between the diode and the equipped electronic support, and an extended area extending out of this contact area, the dissipation of the heat taking place essentially at this extended area.

More particular, the invention concerns an equipped flexible electronic support, of the equipped "flexboard" type, for a motor vehicle light, the equipped electronic support comprising:
  a flat flexible insulating support equipped on a first face with plurality of flat conductive tracks;
  at least one light source of the light emitting diode type disposed on the first face of the flexible insulating support and connected to at least one of the flat conductive tracks;
  a second face of the flexible insulating support is covered at least partially by a layer of thermally conductive material for dissipating the heat produced by the light emitting diodes, the layer comprising a contact area at the connection between the light emitting diode and the equipped flexible electronic support, and at least one extended area extending out of this contact area, the layer of thermally conductive material at least partially covering the second face of the flexible insulating support at the extended area, the dissipation of the heat taking place essentially at this extended area.

The equipped flexible electronic support according to the invention can comprise, in addition to the main characteristics that have just been mentioned in the previous paragraph, one or more additional characteristics from the following:
  each light emitting diode disposed on the first face of the flexible insulating support is associated with a stiffening element disposed at the diode with which it is associated on the second face of the flexible insulating support;
  the stiffening element has at least one opening intended to receive a fixing pin, the fixing pin belonging to a three-dimensional optical part on which the equipped flexible electronic support is placed;
  the stiffening elements have at least one area forming a projection;
  the opening in the stiffening element has a plurality of retention tongues for holding, after deformation, the fixing pin that is intended for it;
  a layer of adhesive with an exclusive holding function is disposed, on the flexible insulating support at each stiffener, in contact with each stiffener;
  the layer of thermally conductive material covers the majority, preferably the whole, of the second face of the flexible insulating support;
  the thickness and the material constituting the layer of thermally conductive material are chosen so that the layer of thermally conductive material is plastic; the equipped flexible electronic support according to the present invention is thus malleable and it is possible to confer varied three-dimensional shapes on it, able to have many inflection points and large changes of direction, for example angles or curvatures greater than 45 degrees. With a certain thickness, chosen according to the material, it is possible to have a manual deformation of the equipped flexible electronic support according to the chosen shape, before mounting, this shape being kept by the support. For example, it is possible to use a sheet of pliable copper, for example, 1 millimeter thick;
  the layer of thermally conductive material has a thickness of less than or equal to 75 microns;
  at least two stiffeners are joined together made in one piece, so that the metal part situated between the contact areas of the stiffeners constitutes the extended area;
  stiffener comprises fins for increasing the heat-dissipation surface;
  the stiffening element and/or the layer of thermally conductive material is/are made from copper;
  the light emitting diodes are of the power light emitting diode type;
  the equipped flexible electronic support comprises several light emitting diodes and several extended areas extending between each light emitting diode.

The present invention also relates to a motor vehicle light comprising an equipped electronic support according to the present invention. Preferentially the equipped flexible support of this light has a three-dimensional arrangement having several inflection points and the flexible support comprises several light emitting diodes, the inflection points being situated between some or all of the light emitting diodes. Preferably there is at least one inflection point between each light emitting diode.

The present invention also relates to a method of manufacturing the equipped flexible electronic support according to the invention, comprising at least the main characteristics, and possibly one or more of the additional characteristics mentioned, the method comprising the various steps of:

covering a second face of the flat insulating support of a flexible electronic support with a thin layer of thermally conductive material, a first face of the insulating support being equipped with a plurality of conductive tracks;

placing at least one light emitting diode on each side of the flexible electronic support, connected to at least one of the conductive tracks, and an associated flat stiffening element, the stiffening element having a thickness of between 0.5 millimeters and 5 millimeters;

then performing a brazing operating by refusion in order to fix the light emitting diodes to the flexible electronic support.

In a particular embodiment of the invention, the step of placing the stiffening element comprises the prior operation consisting of disposing an adhesive with the sole function of holding on the thin layer of thermally conductive material at the stiffening element.

Another object of the invention lies in the use of the equipped flexible electronic support according to the invention, comprising at least the main characteristics and possible one or more of the additional characteristics mentioned, in a motor vehicle light device of the DRL type.

In the various embodiments according to the present invention, the flexboard supports and connects the LED electrically. The layer of thermally conductive material dissipates the heat emitted by the LED. Preferentially, the stiffener makes it possible to protect the connection of the LED on the flexboard, to ensure the precision of its positioning in relation to the lens and to fix the LED plus flexboard assembly to the lens, by clamping, by a gripping means or by riveting by means of ultrasound, or any other plastic deformation.

These and other objects and advantages of the invention will be apparent from the following description, the accompanying drawings and the appended claims.

BRIEF DESCRIPTION OF THE ACCOMPANYING DRAWINGS

The invention and its various applications will be understood better from a reading of the following description and an examination of the figures that accompany it.

They are presented only by way indication and are in no way limitative of the invention. The figures show:

FIG. 1, already described, is a schematic representation of an example embodiment of an equipped flexible electronic circuit of the prior art;

FIG. 2, also already described, is a schematic representation of a cross-section through the example embodiment in FIG. 1;

DETAILED DESCRIPTION OF THE PREFERRED EMBODIMENTS

The various elements appearing in several figures will, unless specified to the contrary, have kept the same reference.

Figure 1:
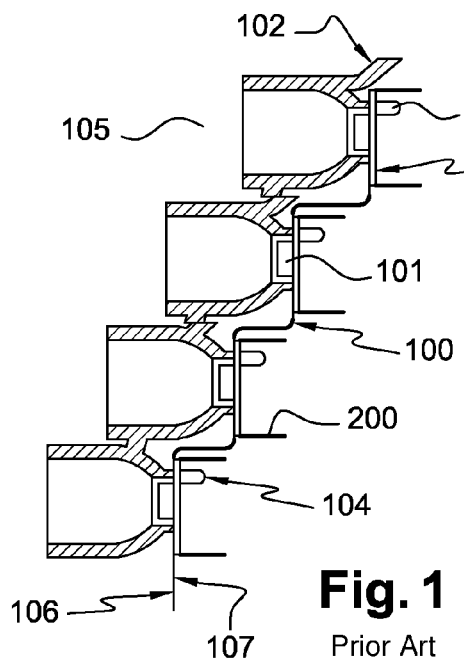

FIG. 1 depicts schematically a cross-section through an optical element 105 intended to be positioned in a lighting device, the optical element 105 resulting from the fixing to a reflector 102 of a flexible electronic support or flexboard 100, equipped, on a first face 106, with light emitting diodes or LEDs 101; the reflector 102 constitutes a three-dimensional environment, since it comprises several support planes for light sources.

Stiffening elements 103 are disposed on a second face 107 of the flexboard 100 at each light emitting diode 101; thus pluralities of diode/stiffener pairs are formed, the two elements of the pairs being disposed on each side of the flexboard 100 while being separated only by the flexible insulating support 202 constituting in this example the flexboard 100. In other words, the position of each LED 101 is approximately centered on the position of the stiffening element 103 that is associated with it. In the manufacture of each stiffening element 103, provision is made for forming openings, including at least one first opening 500 intended to receive a fixing pin 104 pointing at a rear face of the reflector 102 in order to ensure the fixing of each stiffening element 103 to the flexboard 100.

Figure 2:
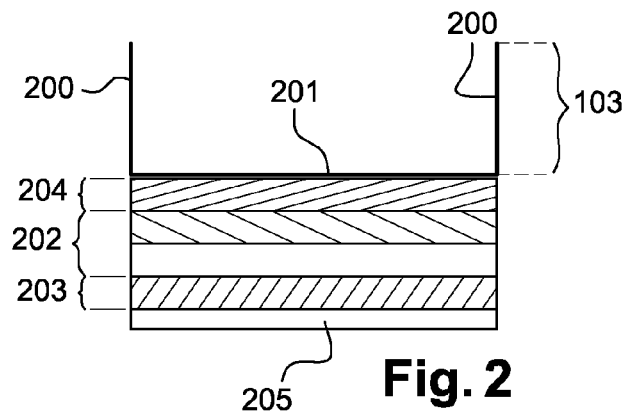

As shown in FIG. 2, a flexboard 100a, here shown in cross-section, consists of a flexible insulating support 202—composed in a known fashion of layers of different materials—on which there are disposed electrically conductive tracks 203 covered with an electrically insulating material 205, must be supplemented by a layer 201 of adhesive 204 intended to provide the heat transfer and the mechanical holding of the stiffening element 103 on its body. The adhesive chosen for the layer 201 of adhesive 204 must have high heat conduction characteristics in order to best transmit the heat given off by the LED 101 at the stiffening element 103.

The stiffening element 103 comprises, on each side of its body, heat dissipation fins 200 perpendicular to the body of the stiffening element 103 in contact with the flexboard 100. This is a non-limitative example. The fins 200 could for example make another angle with the body of the stiffening element 103. The radiator elements can consist of a simple metal plate, bent in order to constitute the fins 200. Other thermally conductive materials can however be envisaged. Different techniques can also be used for obtaining the radiator elements with fins 200, such as molding, extrusion or machining techniques.

As shown, the body of the stiffening element 103 therefore constitutes the layer of thermally conductive material covering the second face of the flexible insulating support 202, and also the contact area at the connection between the LED 101 and the equipped flexible electronic support 100. The heat emitted by the LED 101 is transmitted via this contact area directly to the extended areas, formed by the fins 200. The heat is dissipated essentially at these extended areas.

Such a device has heat dissipation properties appreciably improved compared with the prior art, while having the following advantages:

photometric advantage because the light emitting diodes are mounted directly on the optical piece; the position of each LED 101 with respect to the part of the reflector 102 where it must be placed is thus more precise, each LED 101 being associated with an independent stiffening element 103; each LED 101 thus keeps freedom of movement that makes it possible to recenter it individually, without causing any movement for the other LEDs 101;

financial advantage because of the reduction in the number of LEDs 101 necessary for obtaining a given flux, by virtue of an optimization of the placing of each of the LEDs 101 within the reflector 102.

However, the stiffening elements 103 are bulky, in particular because of the presence of fins 200. This bulk is detrimental since it results in an increase in the volume of final product in which the flexboard 100 will be installed. Apart from the space requirement in the final product the presence of the fins 200 makes it necessary to assemble the stiffening elements 103 on the flexboard 100 after an operation of brazing by re-fusion of the flexboard 100 equipped with the LEDs 101, the thickness of the lugs preventing from placing the stiffening elements 103 on the plates involved in such brazing operations. The process of manufacturing the equipped flexboard 100 is thus made more complex.

According to another embodiment, not shown, at least two stiffening elements 103 are produced in one piece. For example, these two stiffening elements 103 are produced from the same sheet of conductive material. In such a case, the portion of the sheet that will connect the area where the stiffening element 103 is in contact with the flexboard 100 at the LED 101 constitutes an area extended out of the contact areas, by means of which the heat is dissipated. The same type of adhesive as previously mentioned is used. According to a variant embodiment, all the stiffening elements 103 are formed from a single sheet. In such case, it is necessary to confer on the sheet a shape enabling each contact area to come into contact with an LED 101.

Although less bulky, such a system is not very adaptable since the equipped flexible electronic support 100 does not have a flexible portion between some LEDs 101. In the extreme case where the assembly is formed by a single sheet, the support can be adapted only to a precise three-dimensional environment and therefore to a given light.

In addition, in the two aforementioned embodiments, the thermally conductive adhesive used is particularly expensive.

Figure 3:
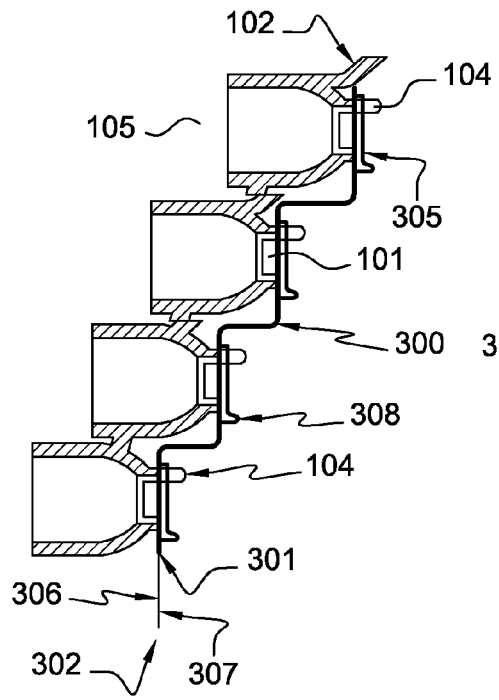
FIG. 3 is a schematic representation of an example embodiment of an equipped flexible electronic circuit according to a particularly advantageous embodiment of the invention.
Figure 4:
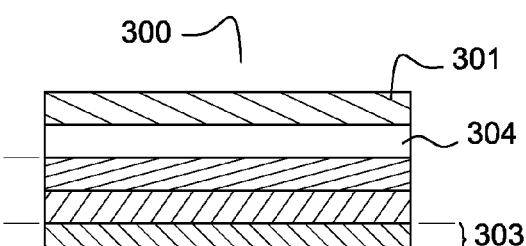
FIG. 4 is a schematic representation of a cross-section through the example embodiment in FIG. 3.

A particularly advantageous embodiment of the present invention, shown in FIGS. 3 and 4, makes it possible to mitigate these drawbacks.

In the example shown in FIG. 3, a flexible electronic support or flexboard 300 equipped according to the invention is put in place in an environment similar to the one in FIG. 1: thus the optical element 105 shown in section, the light emitting diodes 101, the reflector 102 and the fixing pins 104 are found again in FIG. 3.

The flexboard 300 is also detailed with reference to FIG. 4 in a view in section. The flexboard 300 consists of a flexible insulating support 302, on a first face 306 of which conductive tracks 303 serving for supplying the LEDs 101 are disposed. The conductive tracks 303 are covered with an insulating material 309. A second face 307 of the flexible insulating support 302 is covered with a thin layer 301 of thermally conductive material, or heat-dissipating material. A layer of adhesive 304 is used in this example for holding the thin layer 301.

The thin layer 301 can be produced from any material having good heat dissipation capabilities, for example copper, aluminum, stainless steel or various copper-based alloys, but also materials based on graphite. The thin layer 301 is not produced from a material of the adhesive type. To obtain optimum heat dissipation, the thickness of the thin layer 301 is preferably of less than 2 millimeters, advantageously between 60 microns and 90 microns, conclusive tests having been carried out with a thickness of 75 microns. Preferentially, the thickness is less than or equal to 75 microns, and particularly between 60 microns and 75 microns.

The thin layer 301 constitutes the layer of thermally conductive materials covering the flexible insulating support 302 according to the present invention. The area situated at the connection between the LED 101 and the equipped flexible electronic support 300 constitutes the contact area. The portion of thin layer 301 that connects each contact area constitutes an area extended outside the contact areas, for which the heat is dissipated. The thin layer 301 being flexible through its thickness and through the material making it up, the equipped electronic support 300 is therefore flexible.

Advantageously, the thin layer 301 covers all the second face 307 of the flexible insulating support 302, thus greatly improving the dissipation of the heat produced by the LEDs 101.

In a particular example embodiment, stiffening elements 305 which consist of a rigid plate, for example metal, and which are placed vertically in line with each light emitting diode 101, are disposed on the same side as the second face 307 and above the thin layer 301. Their function is in particular to ensure the holding of the light emitting diodes 101 when they are disposed on the flexboard 300, but also during operations of mounting on the optical pieces of the reflector type.

The presence of the thin layer 301 and its capacity to dissipate the heat produced by the LEDs 101 makes it possible to use stiffening elements 305 without fins. The heat exchange is essentially effected at the thin layer 301 situated between two stiffening elements 305. A substantial gain in thickness of the equipped flexboard 300 is thus achieved compared with the embodiment depicted in FIGS. 1 and 2.

The stiffening elements 305 are advantageously held on the thin layer 301 by an adhesive having solely properties of mechanical strength; the stiffening elements 305 do not serve as a radiator and it is not therefore necessary to use an adhesive—more expensive—having good heat exchange characteristics. The thickness of the stiffening elements 305 is around 0.5 to 3 millimeters. They may, in order to increase their rigid character, have an area forming a projection 308, for example in the form of a protrusion extending along the entire side of the stiffening element 305. Even with the area forming a projection, the stiffeners do not exceed 5 millimeters in thickness.

In all cases, whether or not there are stiffeners present, the equipped flexboard 300 according to the invention can be totally equipped before undergoing brazing operations by re-fusion intended essentially to solder the LEDs 101 to the flexboard 300. This is because no element is too bulky to be disposed on the plates taking part in such brazing operations by re-fusion.

It should be noted that, in the case where the size constraints in the light where the equipped flexible electronic support 300 is to be mounted are not high, it is always possible to use a stiffening element 305 with fins in addition to the thin layer 301, in order to increase even further the heat dissipation capacity. However, since the thin layer 301 gives sufficient heat dissipation, it is generally preferred to reduce the size of the equipped electronic flexible support 300.

Fixing pins 104 are intended to be introduced into openings in the stiffening element 305, passing through the flexboard 300 pierced for this purpose.

Figure 5:
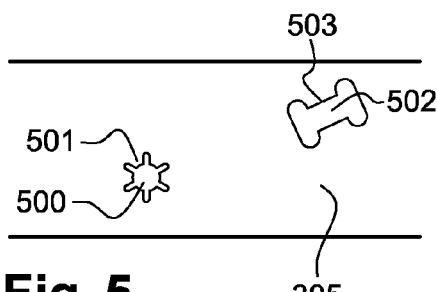
FIG. 5 is an example of means of fixing the flexible electronic circuit according to the invention on an optical piece.

FIG. 5 shows two examples of openings provided in the stiffening element 305. These examples of openings can be applied to the various stiffening elements 103 or 305 of various embodiments according to the present invention, in particular those depicted in FIGS. 1 and 3. In the first example of an opening 500 and a second example of an opening 502, each opening is intended to receive a fixing pin 104 pointing at a rear face of the reflector 102. It is then possible to proceed with the assembly of the equipped flexboard 300 and the reflector 102 by introducing one of the fixing pins 104 of the reflector 102 into each opening. A supplementary clipping operation between the equipped flexboard 300 and the reflector 102 can then be carried out in order to ensure the definitive holding between the elements.

In an advantageous embodiment, namely the first example, the first opening 500 is characterized by a roughly circular shape, with a periphery having a plurality of retention tongues 501. Each retention tongue 501 is characterized by a base, directly attached to the stiffening element 305, and by a free end, oriented towards the central part of the first opening 500. Such an opening thus constitutes a clamping means or a means for gripping. It should be noted that such a means can also be produced by an opening having a single retention tongue 503 as is the case with the second opening 502, in the second example.

When one of the fixing pins 104 is introduced into the openings 500 and/or 502, each retention tongue 501 and/or 503 can slightly deform in the direction of the introduction movement, the free ends of each retention tongue 501 then accompanying the fixing pin 104 in its change. The plurality of retention tongues 501 of the first opening 500 make it possible best to hold the fixing pin 104 in the first opening 500: the elastic character of the material employed to produce the stiffening element 305, and therefore to produce the retention tongues 501, has this advantage of interfering with a movement that is the reverse of the movement of introducing the fixing pin 104 into the first opening 500.

The main function of the second opening 502 is to receive one of the fixing pins 104 in order to prevent any rotation of the stiffening element 305. In practice, provision is made for each light emitting diode 101 to be associated with two fixing pins 104. The flexboard 300 then has a number of openings equal to twice the number of LEDs 101.

The stiffening elements 305 are then preferably produced from a ductile material, for example copper. Two openings per stiffening element 305 prevent any rotation of the stiffening elements 305 during operations of mounting the equipped flexible electronic supports 300 according the invention.

Other fixing methods, based on ultrasound for crushing the fixing pins 104 or snap riveting operations, can also be used to hold the equipped flexboards 300 according to the invention on any optical support.

While the method herein described, and the forms of apparatus for carrying this method into effect, constitute preferred embodiments of this invention, it is to be understood that the invention is not limited to this precise method and forms of apparatus, and that changes may be made in either without departing from the scope of the invention, which is defined in the appended claims.

What is claimed is:

1. An equipped flexible electronic support for a motor vehicle light, said equipped flexible electronic support comprising:
    a flat flexible insulating support equipped on a first face with a plurality of flat conductive tracks;
    at least one light source comprising a plurality of light emitting diodes disposed on said first face of said flat flexible insulating support and connected to at least one of said plurality of flat conductive tracks;
    wherein a second face of said flat flexible insulating support is at least partially covered with a layer of thermally conductive material for dissipating heat produced by each of said plurality of light emitting diodes, said layer of thermally conductive material comprising a contact area at a connection between each of said plurality of light emitting diodes and said equipped flexible electronic support, and at least one extended area extending out of said contact area and between adjacent ones of said plurality of light emitting diodes, said layer of thermally conductive material at least partially covering said second face of said flat flexible insulating support at said at least one extended area, the dissipation of heat taking place essentially at said at least one extended area
    wherein said layer of thermally conductive material comprising a plurality of said contact areas and said layer of thermally conductive material extending between adjacent ones of said adjacent plurality of contact areas.

2. The equipped flexible electronic support according to claim 1, wherein each of said plurality of light emitting diodes disposed on said first face of said flat flexible insulating support is associated with a stiffening element disposed at said plurality of light emitting diodes with which it is associated on said second face of said flat flexible insulating support.

3. The equipped flexible electronic support according claim 2, wherein said stiffening element has at least one opening intended to receive a fixing pin, said fixing pin belonging to a three-dimensional optical part on which said equipped flexible electronic support is placed.

4. The equipped flexible electronic support according to claim 3, wherein said at least one opening in said stiffening element has a plurality of retention tongues for holding, after deformation, said fixing pin that is intended for it.

5. The equipped flexible electronic support according to claim 1, wherein said layer of thermally conductive material covers the majority of said second face of said flat flexible insulating support.

6. The equipped flexible electronic support according to claim 1, wherein a thickness and material constituting said layer of thermally conductive material are chosen so that said layer of thermally conductive material is plastic.

7. The equipped flexible electronic support according to claim 1, wherein said layer of thermally conductive material has a thickness of less than 2 millimeters.

8. The equipped flexible electronic support according to claim 1, wherein said layer of thermally conductive material has a thickness of less than or equal to 75 microns.

9. The equipped flexible electronic support according to claim 2, wherein at least one of said stiffening element or said layer of thermally conductive material is made from copper.

10. The equipped flexible electronic support according to claim 1, wherein each of said plurality of light emitting diodes is of a power light emitting diode type.

11. A motor vehicle headlight according to claim 1, wherein said motor vehicle headlight comprises an equipped flexible electronic support.

12. The motor vehicle headlight according to claim 11, wherein said equipped flexible electronic support has a three-dimensional arrangement having several inflection points and said equipped flexible electronic support comprises said plurality of light emitting diodes with the inflection points being situated between some or all of said plurality of light emitting diodes.

13. An equipped flexible electronic support for a motor vehicle light, said equipped flexible electronic support comprising:

a flexible insulating support equipped on a first face with a plurality of conductive tracks;

a plurality of light emitting diodes disposed on said first face of said flexible insulating support and connected to at least one of said plurality of conductive tracks;

wherein a second face of said flexible insulating support is at least partially covered with a layer of thermally conductive material for dissipating heat produced by said plurality of light emitting diodes, said layer of thermally conductive material comprising a contact area at a connection between each of said plurality of light emitting diodes and said equipped flexible electronic support, and at least one extended area extending out of said contact area and between adjacent ones of said plurality of light emitting diodes, said layer of thermally conductive material at least partially covering said second face of said flexible insulating support at said at least one extended area, the dissipation of heat taking place essentially at said at least one extended area wherein said layer of thermally conductive material comprising a plurality of said contact areas and said layer of thermally conductive material extending between adjacent ones of said adjacent plurality of contact areas.

14. The equipped flexible electronic support according to claim 13, wherein said plurality of light emitting diodes are disposed on said first face of said flexible insulating support is associated with a stiffening element disposed at said plurality of light emitting diodes with which it is associated on said second face of said flexible insulating support.

15. The equipped flexible electronic support according claim 14, wherein said stiffening element has at least one opening intended to receive a fixing pin, said fixing pin belonging to a three-dimensional optical part on which said equipped flexible electronic support is placed.

16. The equipped flexible electronic support according to claim 15, wherein said at least one opening in said stiffening element has a plurality of retention tongues for holding, after deformation, said fixing pin that is intended for it.

17. The equipped flexible electronic support according to 13, wherein said layer of thermally conductive material has a thickness of less than 2 millimeters.

18. The equipped flexible electronic support according to claim 17, wherein said layer of thermally conductive material has a thickness of less than or equal to 75 microns.

19. A method of manufacturing an equipped flexible electronic support, comprising the steps of:

covering a second face of an insulating support of a flexible electronic support with a thin layer of thermally conductive material, a first face of said insulating support being equipped with a plurality of conductive tracks;

placing a plurality of light emitting diodes on each side of said flexible electronic support, connected to at least one of said plurality of conductive tracks, and an associated flat stiffening element, said flat stiffening element having a thickness of between about 0.5 millimeters to about 5 millimeters; and performing a brazing operating by refusion in order to fix said plurality of light emitting diodes to said flexible electronic support;

said thin layer of thermally conductive material extending on said second face of said flexible electronic support between adjacent ones of said plurality of light emitting diodes wherein said layer of thermally conductive material comprising a plurality of said contact areas and said layer of thermally conductive material extending between adjacent ones of said adjacent plurality of contact areas.

* * * * *

UNITED STATES PATENT AND TRADEMARK OFFICE
CERTIFICATE OF CORRECTION

| | | |
|---|---|---|
| PATENT NO. | : 7,832,913 B2 | Page 1 of 1 |
| APPLICATION NO. | : 12/101265 | |
| DATED | : November 16, 2010 | |
| INVENTOR(S) | : Vincent Biarne and Gérard Billot | |

It is certified that error appears in the above-identified patent and that said Letters Patent is hereby corrected as shown below:

On the title page in (73) please delete "Veleo Vision" and insert --Valeo Vision-- therefor.

In Column 4, line 59, please add the word "each" before the word stiffener.

In Column 10, Line 14, please add a ";" after the word area.

In Column 10, Line 27, please add the word "to" before the word claim.

In Column 11, Line 19, please add a ";" after the word area.

In Column 11, Line 31, please add the word "to" before the word claim.

In Column 12, Line 29, please add a ";" after the word diodes.

Signed and Sealed this
Twelfth Day of April, 2011

David J. Kappos
*Director of the United States Patent and Trademark Office*